(12) United States Patent
Yasuda

(10) Patent No.: US 6,441,463 B2
(45) Date of Patent: Aug. 27, 2002

(54) IGBT, CONTROL CIRCUIT, AND PROTECTION CIRCUIT ON SAME SUBSTRATE

(75) Inventor: Yukio Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,190

(22) Filed: Jan. 9, 2001

(30) Foreign Application Priority Data

Jun. 29, 2000 (JP) ........................................ 2000-196518

(51) Int. Cl.$^7$ ............................................ H01L 27/082
(52) U.S. Cl. ........................ 257/577; 257/572; 307/131
(58) Field of Search ................................ 257/585, 577, 257/572

(56) References Cited

U.S. PATENT DOCUMENTS

| | | | |
|---|---|---|---|
| 5,536,958 A | 7/1996 | Shen et al. | 257/356 |
| 5,631,494 A | * 5/1997 | Sakurai et al. | 257/572 |
| 5,654,225 A | 8/1997 | Zambrano | 438/138 |
| 5,723,916 A | * 3/1998 | Disney et al. | 307/131 |

FOREIGN PATENT DOCUMENTS

| | | |
|---|---|---|
| JP | 64-51664 | 2/1989 |
| JP | 7-169963 | 7/1995 |
| JP | 8-306924 | 11/1996 |

OTHER PUBLICATIONS

K. Yoshida, et al., "A Self–Isolated Intelligent IGBT for Driving Ignition Coils", Proceedings of 1998 International Symposium of Power Semiconductor Devices & ICs, Kyoto, pp. 105–108—Month Unknown.

* cited by examiner

*Primary Examiner*—David Nelms
*Assistant Examiner*—Tu-Tu Ho
(74) *Attorney, Agent, or Firm*—Oblon, Spivak, McClelland, Maier & Neustadt, P.C.

(57) ABSTRACT

Latch-up of each of parasitic thyristors (T1–T4), which occurs when a circuit element (B1) is formed on a semiconductor substrate in which an IGBT (Z1) has been formed, is prevented by a circuit for preventing the latch-up using Schottky barrier diodes (D2, D3) formed on the semiconductor substrate. Each of the Schottky barrier diodes (D2, D3), which is composed of a junction between a diffused layer used for forming the circuit element and a metal wiring layer, is used in the circuit for preventing the latch-up action of each of the parasitic thyristors (T1–T4). Thereby, the area of the semiconductor device can be made smaller while the semiconductor device can have a higher protection effect.

10 Claims, 7 Drawing Sheets

IGBT, CONTROL CIRCUIT, AND PROTECTION CIRCUIT ON SAME SUBSTRATE

BACKGROUND OF THE INVENTION

1. Field of the Invention

The present invention relates to a semiconductor device in which an insulated gate bipolar transistor and a control circuit are formed on a same semiconductor substrate. In particular, it relates to a construction of a protection device or protection circuit for preventing latch-up due to a parasitic device which occurs on the occasion of forming the control circuit on the insulated gate bipolar transistor using the joining and separating technique.

2. Description of the Prior Art

In general, when a circuit region or circuit element etc. is formed on a semiconductor substrate in which an insulated gate bipolar transistor (Hereinafter, it will be referred to "IGBT".) is formed, a parasitic device which deteriorates the properties of the circuit, may occur. Therefore it has been tried to provide various methods of forming the circuit region or circuit element etc. which can restrain the action of the parasitic device.

For example, in the technical field for forming the circuit region by means of the joining and separating technique without using a particular technique for forming the substrate, a method of forming the above-mentioned circuit region or circuit device etc. is disclosed in the technical document of "A Self-isolated Intelligent IGBT for Driving Ignition Coils (International Symposium on Power Semiconductor Drives & Ics, 1998)" published in 1998. In the technical document, there is disclosed such a means for preventing a breakdown of the device by using a circuit in which a resistor and a diode formed on a polycrystalline silicon layer are combined, in order to avoid the breakdown of the circuit due to the action of a parasitic thyristor which may cause a fatal problem in the joining and separating technique.

Meanwhile, in each of the Japanese Laid-open Patent Publications No. 7-169963, No. 8-306924 and No. 64-51664 also, there is disclosed a technique for restraining the action of a parasitic device in a semiconductor device provided with an IGBT or MOSFET.

In FIG. 9, there is partially shown a conventional circuit for preventing the action of a parasitic thyristor, which is disclosed in the above-mentioned technical document. In FIG. 9, P1 denotes an input terminal for controlling a semiconductor device B2 in which a control circuit B1 is formed on a semiconductor substrate in which an IGBT Z1 is formed. P2 denotes an emitter terminal of the IGBT Z1, which acts as the ground terminal of the control circuit B1 also. P3 denotes a collector terminal of the IGBT Z1.

The input terminal P1 is connected to the cathode of a Zener diode D1 through a resistor R1. On the other hand, the anode of the Zener diode D1 is connected to the emitter terminal P2. Further the cathode of the Zener diode D1 is also connected to one end portion of a resistor R2. The other end portion of the resistor R2 is connected to one end portion of a resistor R3 and to the cathode of a Zener diode D8. The other end portion of the resistor R3 is connected to the control circuit B1. Meanwhile the anode of the Zener diode D8 is connected to the emitter terminal P2.

Each of the resistors R2, R3 and the diodes D1, D8 is formed on a polycrystalline silicon layer (Hereinafter, it will be referred to "polysilicon layer".) formed above the substrate in which the IGBT Z1 is formed, while interposing an insulating film therebetween. In the device described in the above-mentioned technical document, the control circuit B1 for controlling the IGBT Z1 is composed of a nch-MOSFET (of enhancement mode or depletion mode)

In FIG. 10, there is shown a construction each of parasitic thyristors of a circuit device in the conventional semiconductor device described above. As shown in FIG. 10, parasitic transistors T1, T2 are formed between each of diffused layers of an nch-MOSFET M and a semiconductor substrate U composing the diffused layers. A p$^-$ type diffused region corresponding to the back gate G of the nch-MOSFET M, an n type diffused layer formed so as to be included in this p$^-$ type diffused region (It corresponds to the source S or drain A of the nch-MOSFET M) and an n$^-$ type layer of the semiconductor substrate U act as the base, emitter and collector of the npn type parasitic transistor T2, respectively. Meanwhile, a p type layer of the semiconductor substrate U, n$^+$ and n$^-$ type layers formed on this p type layer and a p$^-$ type diffused layer corresponding to the back gate G of the nch-MOSFET M act as the emitter, base and collector of the pnp type parasitic transistor T1, respectively.

The parasitic transistors T1, T2 become such a state that the collector of the parasitic transistor T1 is connected to the base of the parasitic transistor T2 while the base of the parasitic transistor T1 is connected to the collector of the parasitic transistor T2, so that a thyristor is formed. In consequence, if the thyristor has become ON state once, it is impossible to make the thyristor become OFF state except making such a state that the collector potential of the IGBT M becomes lower than the emitter potential of the IGBT M.

As patterns that the thyristor becomes ON state, the following two patterns may be estimated. One is such a case that the source potential of the nch-MOSFET M becomes lower than the back gate potential so that emitter current is generated in the npn type parasitic transistor T1. The other is such a case that the pnp type parasitic transistor T1 becomes ON state in accordance with the ON state of the IGBT M formed on the same substrate. In this case, the collector current of the pnp type parasitic transistor T1 flows into the back gate G of the nch-MOSFET M so that the potential of the back gate G is lowered. In consequence, when it becomes higher than the potential of the source S or drain A of the nch-MOSFET M, latch-up occurs as same as the case described above.

In particular, if an interface for the outer device of the semiconductor device is provided as the input terminal P1, it may be more probable that the potential of the input terminal P1 becomes lower than the potential of the emitter terminal P2. Although its period is shorter than the period to cause a surge, it is estimated that a larger stress may be applied to it due to a momentary current. Therefore, in this case also, it is probable that latch-up is caused.

So, when the protection circuit for protecting the input terminal P1 shown in FIG. 9 is used, it is prevented that parasitic devices occur between the protection circuit and the semiconductor substrate, by making the whole protection circuit as a device formed on the polysilicon. Thus, the emitter current flowing through the npn type parasitic transistor T2 is restrained by effects on the circuit so that it is prevented that the parasitic thyristor causes latch-up.

When the device is actually formed, a resistor R3 is certainly disposed in series for the npn type parasitic transistor T2 in which the source S or drain A of the nch-MOSFET M formed in the control circuit B1 acts as the emitter of the transistor T2. Thus it is restrained that the voltage between the resistor R3 and the emitter of the npn type parasitic transistor T2 is lowered, because the voltage of the Zener diode D8 in the forward direction is lowered. Similarly, it is designed such that the current of the circuit composed of the Zener diode D8, the resistor R3 and the control circuit B1 passes through the resistor R2 connected in series thereto. Thus the voltage drop caused in the above-mentioned circuit due to the resistor R2 is restrained, because the voltage of the Zener diode D1 in the forward direction is lowered.

In the conventional technique described above, the current flowing the parasitic device is restrained due to the voltage drop of the diode in the forward direction and the voltage drop at the series resistor in the circuit connected to the diode in parallel. Therefore, the voltage drop of the Zener diode D8 in the forward direction is smaller than the voltage between the base and the emitter of the npn type parasitic transistor T2 in the control circuit B1. In consequence, if the voltage drop of the Zener diode D1 in the forward direction is not smaller than that of the Zener diode D8, the effect to prevent the action of the parasitic thyristor may be smaller. Hereupon, in order to decrease the voltage drop of the diode in the forward direction using the same device, it is necessary to enlarge the area of the pn junction. Therefore the diode is formed in a considerably larger size in comparison with the circuit region to obtain a desired proof current.

In the conventional technique described above, the circuit region is composed of only the nch-MOSFET. Therefore, when the npn type parasitic transistor occurs, the area of the junction is smaller. In consequence, the voltage between the base and the emitter becomes comparatively larger. However, if it is intended to form the circuit region including the pch-MOSFET in the circuit forming process, the area of the junction becomes larger than that of the circuit including only the nch-MOSFET. Therefore, when the circuit for preventing the parasitic thyristor is formed, there may be required a larger protection circuit in comparison with the case of forming the circuit including only the nch-MOSFET. If the region of the protection circuit becomes larger as described above, the semiconductor device provided with the protection circuit becomes larger also. In consequence, it is feared that the cost for manufacturing the semiconductor device may increase.

SUMMARY OF THE INVENTION

The present invention has been developed to solve the aforementioned conventional problems, and its object is to provide a semiconductor device of a compact construction, in which an IGBT and a control circuit are formed in a same substrate, capable of effectively restraining the action of a parasitic device.

A semiconductor device according to the present invention developed for solving the aforementioned problems, is characterized in that if a pch-MOSFET is formed on a semiconductor substrate in which an IGBT has been formed, a circuit for preventing latch-up can have a smaller area in comparison with the conventional one by forming a diode using a diffused region which is necessary for forming the pch-MOSFET.

Namely, a Schottky barrier diode is formed on the semiconductor substrate in which the IGBT has been formed, and then the circuit for preventing the latch-up of the parasitic thyristor is formed by combining the Schottky barrier diode with a Zener diode formed on a polycrystalline silicon member. That is, it has a construction as follows. Namely, by using the Schottky barrier diode, a voltage in the forward direction, which is lower than the voltage between the base and the emitter of the npn type parasitic transistor of the circuit region, can be easily obtained with a smaller area. Thus, the circuit for preventing the latch-up of the parasitic thyristor is made smaller so that the semiconductor device can have a higher safety and a lower cost in comparison with the conventional one.

To put it concretely, a semiconductor device according to the present invention, in which an IGBT and a circuit region or circuit element for control use are formed on a same semiconductor substrate, is characterized in that it includes (i) a first diffused layer formed in the semiconductor substrate so as to be located near a surface of the semiconductor substrate, the first diffused layer having a conduction type different from that of the semiconductor substrate, (ii) a second diffused layer formed in the semiconductor substrate so as to be located near the surface of the semiconductor substrate, the second diffused layer being located within the first diffused layer, and the second diffused layer having a conduction type different from that of the first diffused layer, (iii) a first region formed on the second diffused layer, the first region being formed by removing a portion of an insulating film, (iv) a first metal wiring layer formed in the first region, (v) a third diffused layer located in the second diffused layer or located so as to intersect with the second diffused layer, the third diffused layer having a conduction type identical to that of the second diffused layer, (vi) a second region formed on the third diffused layer, the second region being formed by removing another portion of the insulating film, (vii) a second metal wiring layer formed in the second region, and (viii) a protection circuit formed by combining a Schottky barrier diode using the first and second metal wiring layers as electrodes and a Zener diode formed by depositing polycrystalline silicon on the insulating film on the semiconductor substrate, the protection circuit being connected to at least one of input terminals of the semiconductor device. Hereupon, the circuit region or circuit element is connected to the input terminal through the protection circuit and to a gate of the IGBT.

According to the semiconductor device of the present invention, for example, if a pch-MOSFET is formed on a semiconductor substrate in which an IGBT has been formed, a circuit for preventing latch-up can have a smaller area by forming a diode using the diffused region which is necessary for forming the pch-MOSFET. Namely, by using the Schottky barrier diode, a voltage in the forward direction, which is lower than the voltage between the base and the emitter of the npn type parasitic transistor of the circuit region, can be easily obtained with a smaller area. Thus, the circuit for preventing the latch-up of the parasitic thyristor is made smaller so that the semiconductor device can have a higher safety and a lower cost. That is, by using the Schottky barrier diode as the circuit for preventing latch-up of the parasitic thyristor, a higher effect to protect the circuit may be obtained with a smaller occupying area in comparison with the conventional case.

In the semiconductor device, each of the first and second metal wiring layers may be composed of aluminum or aluminum containing a minute quantity of other element. In this case, because the metal wiring layers are composed of aluminum or aluminum containing other element(s), the metal wiring layers may be easily formed so that the cost for manufacturing the semiconductor device may be lowered.

The semiconductor device may further include a fourth diffused layer formed so as to surround a junction between the second diffused layer and the first metal wiring layer.

Hereupon, the fourth diffused layer preferably has a conduction type different from that of the second diffused layer. In this case, the performance of the semiconductor device may be improved by the fourth diffused layer.

In the semiconductor device, the Schottky barrier diode may include a first and second Schottky barrier diode members while the Zener diode may include a Zener diode member. Hereupon, a cathode of the Zener diode member and an anode of the first Schottky barrier diode member are preferably connected to the input terminal of the semiconductor device. A cathode of the first Schottky barrier diode member is preferably connected to a cathode of the second Schottky barrier diode member and to the circuit region or circuit element. An anode of the Zener diode member and an anode of the second Schottky barrier diode member are preferably connected to an emitter of the insulated gate bipolar transistor. In this case, the action of the parasitic transistor may be more effectively restrained by the above-mentioned circuit structure.

In the semiconductor device, the input terminal of the semiconductor device may be connected to one end portion of a resistor while the other end portion of the resistor is connected to the cathode of the Zener diode member and to the anode of the first Schottky barrier diode member. In this case, the action of the parasitic transistor may be further more effectively restrained by the resistor disposed between the first Zener diode member and the first Schottky barrier diode member.

In the semiconductor device, the Zener diode may include a further Zener diode member. Hereupon, an anode of the further Zener diode member is preferably connected to the anode of the Zener diode member. A cathode of the further Zener diode member is preferably connected to the emitter of the IGBT. In this case, the action of the parasitic transistor may be more effectively restrained by the above-mentioned circuit structure.

The semiconductor device may further include one or more input terminal. Hereupon, the semiconductor device may include at least one circuit having a construction as same as that of the circuit composed of the Zener diode member and the first and second Schottky barrier diode members. In this case, the function of the semiconductor device may be improved, because it is provided with a plurality of input terminals and protection circuits.

In the semiconductor device, the fourth diffused layer may be composed of a diffusion layer used for forming the IGBT. In this case, because the fourth diffused layer is formed by utilizing the diffusion layer used for forming the IGBT, the process for manufacturing the semiconductor device may be simplified so that the cost for manufacturing it may be lowered.

The semiconductor device may further include a metal-diffused layer located between the second diffused layer and the first metal wiring layer. The metal-diffused layer is preferably formed by diffusing or depositing a metal between the second diffused layer and the first metal wiring layer. Hereupon, the diffused or deposited metal is different from the metal composing the first metal wiring layer. In this case, the action of the parasitic transistor may be much more effectively restrained by the metal-diffused layer.

In the semiconductor device, the diffused or deposited metal may be platinum. In this case, the voltage applied to the input terminal may be transmitted to the circuit region or circuit element with a smaller voltage loss.

BRIEF DESCRIPTION OF THE DRAWINGS

The present invention will become more fully understood from the detailed description given below and the accompanying drawings, wherein.

DETAILED DESCRIPTION OF THE PREFERRED EMBODIMENTS

Hereinafter, embodiments of the present invention will be concretely described with reference to the accompanying drawings.

First Embodiment

At first, the semiconductor device according to the first embodiment of the present invention will be described with reference to FIG. 1.

Figure 1:
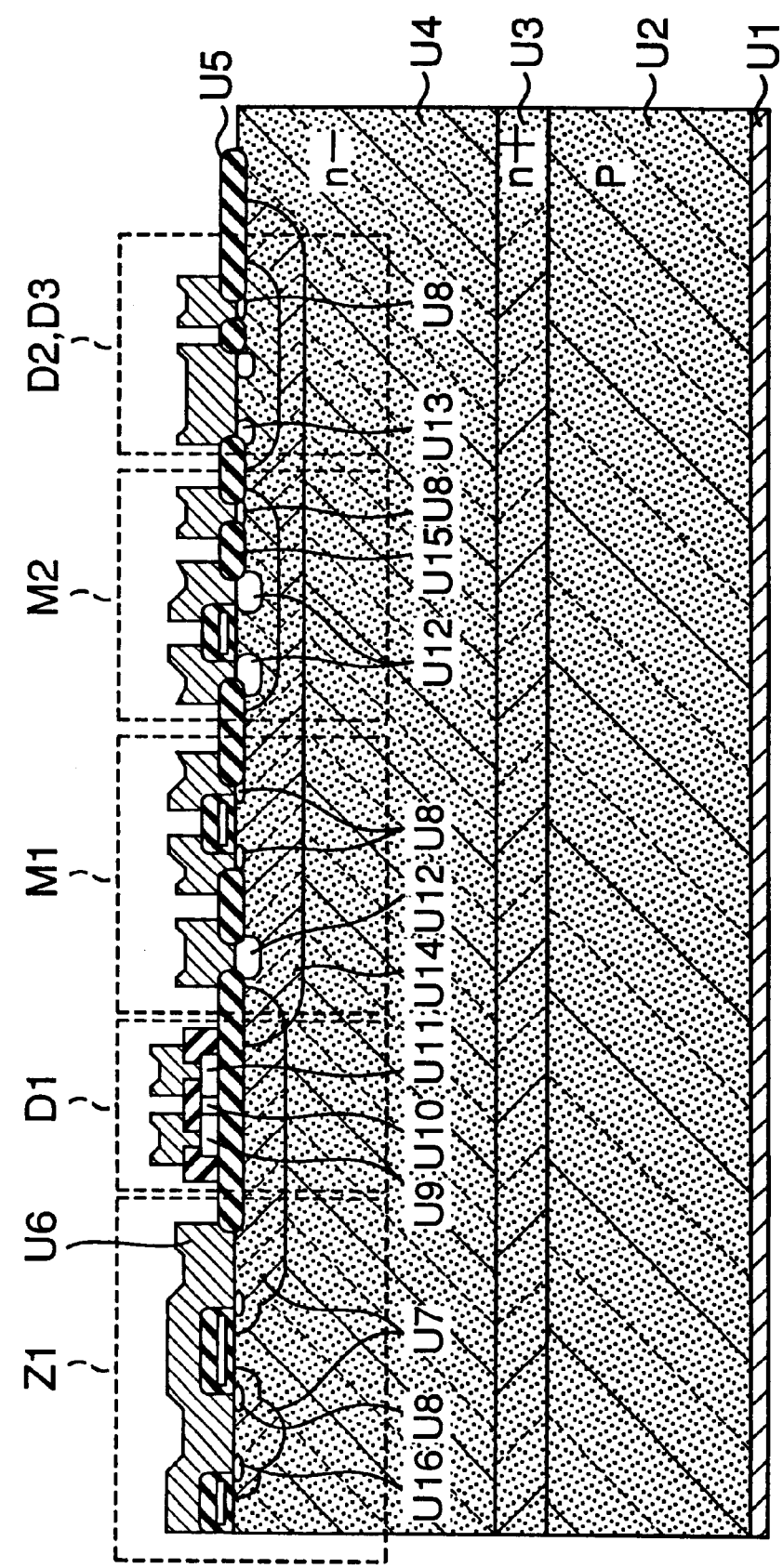
FIG. 1 is a vertical section of a semiconductor device according to a first embodiment of the present invention, in which an IGBT and a control circuit are formed on a same substrate.

In FIG. 1, U2 denotes a semiconductor substrate (p type) for forming an IGBT and a control circuit. U3 denotes an $n^+$ type layer formed on the semiconductor substrate U2 by means of epitaxial growth. U4 denotes an $n^-$ type layer formed on the $n^+$ type layer U3 by means of epitaxial growth. U1 denotes a metal back layer formed on the back surface of the semiconductor substrate U2.

Z1 denotes the region of the IGBT formed above the semiconductor substrate U2. The IGBT Z1 has such a construction that it can drive a larger current by disposing a plurality of elements of predetermined fundamental structures in a plane state so as to be connected to one another in parallel. D1 denotes a Zener diode. The Zener diode D1 is provided with a $p^+$ type diffused layer U9, a $p^-$ type diffused layer U10 and an $n^+$ type diffused layer U11, each of which has been formed by diffusing impurities into a polysilicon layer deposited on insulating films such as an oxide film U5 etc. above the semiconductor substrate U2. The diffused layers U9–U11 are joined or formed in the direction parallel to the surface of the semiconductor substrate U2.

M1 denotes an nch-MOSFET. The nch-MOSFET M1 has such a construction that a p$^+$ type diffused layer U12 of higher concentration and n$^-$ type diffused layer U8 of higher concentration are formed on the n$^-$ type layer U4 so as to be included in a region of a deep p$^-$ type diffused layer U14 of lower concentration. M2 denotes a pch-MOSFET. The pch-MOSFET M2 has such a construction that an n$^-$ type diffused layer U15 of lower concentration is formed so as to be included in a region of the p$^-$ type diffused layer U14 of lower concentration while the p$^+$ type diffused layer U12 and the n$^+$ type diffused layer U8 are formed so as to be included in the n$^-$ type diffused layer U15.

D2 and D3 denote Schottky barrier diodes (Schottky barrier diode members). Each of the Schottky barrier diodes D2, D3 has such a construction that the n$^-$ type diffused layer U15 of lower concentration is formed so as to be included in a region of the p$^-$ type diffused layer U14 of lower concentration while the p type diffused layer U13 and the n$^+$ type diffused layer U8 are formed so as to be included in the n$^-$ type diffused layer U15. In each of the Schottky barrier diodes D2, D3, one terminal connected to the p$^+$ type diffused layer U8 becomes the cathode while the other terminal becomes the anode.

Figure 8:
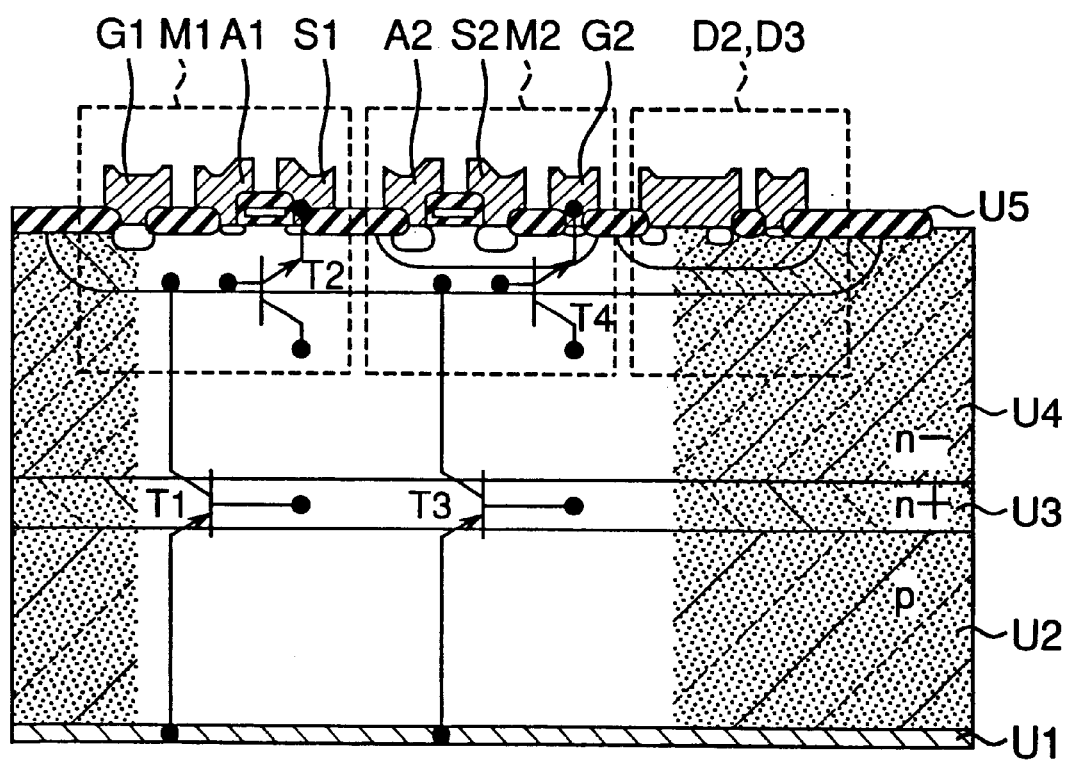
FIG. 8 is a vertical section of the semiconductor device according to the present invention, for explaining constructions of parasitic thyristors which occur in the semiconductor device.

FIG. 8 shows the construction of parasitic thyristors of the circuit element in the semiconductor device shown in FIG. 1. In FIG. 8, G1 and G2 denote back gates of the nch-MOSFET M1 and the pch-MOSFET M2, respectively. A1 and A2 denote drains of the nch-MOSFET M1 and the pch-MOSFET M2, respectively. S1 and S2 denote sources of the nch-MOSFET M1 and the pch-MOSFET M2, respectively.

Figure 10:
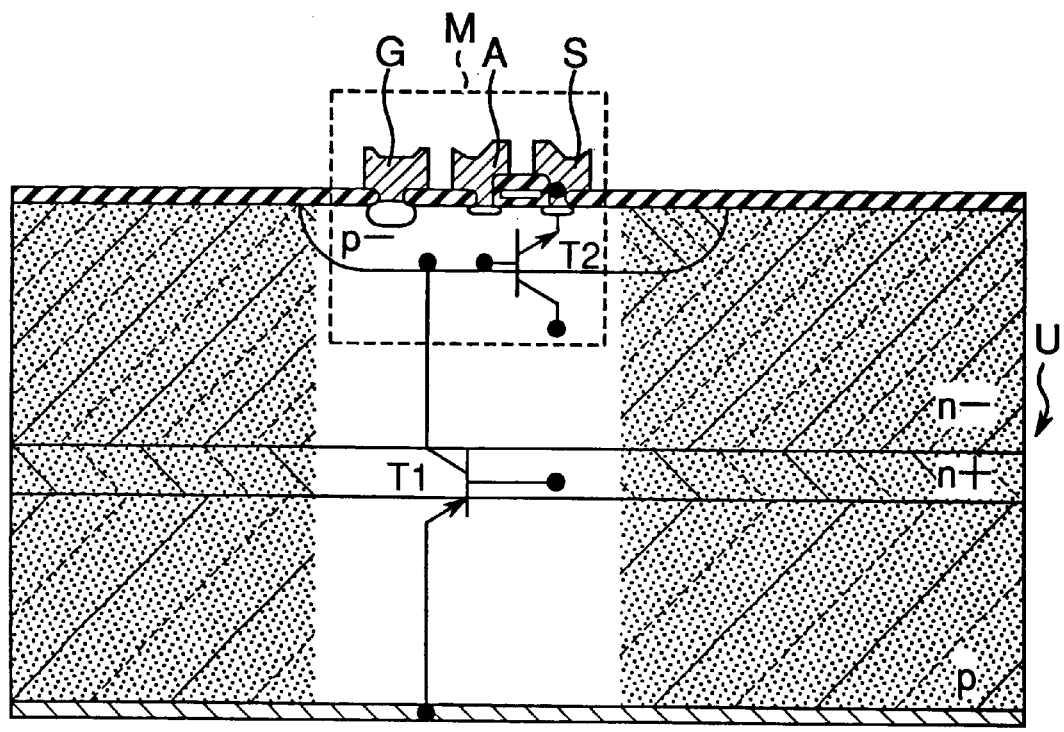
FIG. 10 is a vertical section of the conventional semiconductor device shown in FIG. 9, for explaining constructions of parasitic thyristors which occur in the semiconductor device.

As shown in FIG. 8, in this semiconductor device, parasitic transistors T1, T2 are formed between each of the diffused layers of the nch-MOSFET M1 and the semiconductor substrate U2 constructing the diffused layers nearly as same as the case of the conventional semiconductor device shown in FIG. 10. Further, parasitic transistors T3, T4 are also formed between each of the diffused layers of the pch-MOSFET M2 and the semiconductor substrate U2 constructing the diffused layers as same as the case of the nch-MOSFET M1. However, in this semiconductor device, as described below, the actions of the parasitic transistors T1–T4 may be effectively restrained with the construction of a compact size or smaller area.

Figure 2:
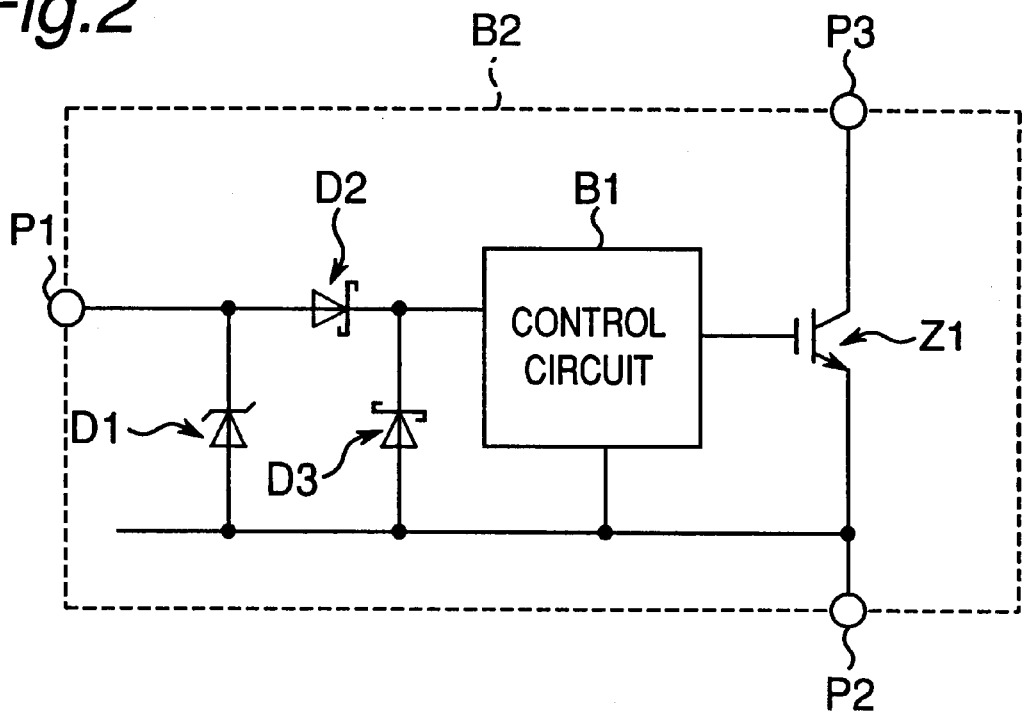
FIG. 2 is a circuit diagram of the semiconductor device shown in FIG. 1.
Figure 9:
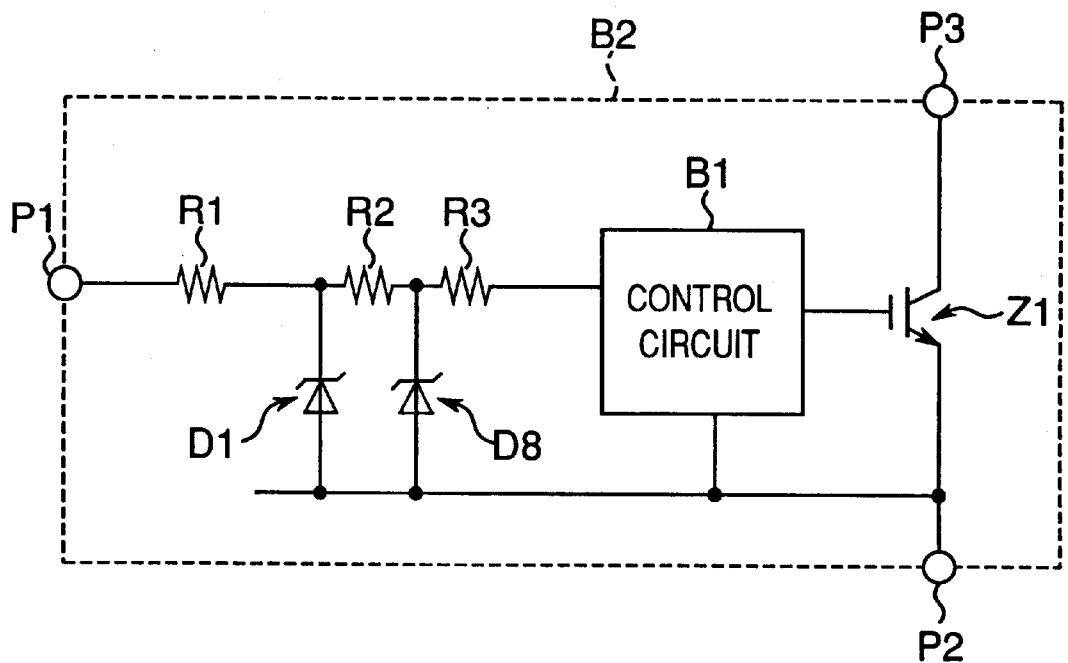
FIG. 9 is a circuit diagram of a conventional semiconductor device, in which an IGBT and a control circuit are formed on a same substrate.

Next, the structure of the circuit connection of the semiconductor device according to the first embodiment of the present invention will be described with reference to FIG. 2. In FIG. 2, the members etc. common with those of the conventional semiconductor device shown in FIG. 9, namely the members having the same structures or functions as those in FIG. 9, are denoted the same reference numerals as those in FIG. 9.

As shown in FIG. 2, in the structure of the circuit connection, the anode of the Schottky barrier diode D2 is connected to an input terminal P1 while the cathode is connected to the control circuit B1 and to the cathode of another Schottky barrier diode D3. The anode of the Schottky barrier diode D3 is connected to an emitter terminal P2. The control circuit B1 is composed of the nch-MOSFET M1 and passive devices or composed of the nch-MOSFET M1, pch-MOSFET M2 and passive devices. The control circuit B1, whose output terminal is connected to the gate of the IGBT Z1, controls the IGBT Z1.

Between the control circuit B1 and the input terminal P1, there is formed a diode circuit including the Zener diode D1 and Schottky barrier diodes D2, D3, the diode circuit having functions nearly as same as that of the conventional semiconductor device or structure of the circuit connection. In the structure of the circuit connection of the above-mentioned type, it is feared that latch-up of the parasitic thyristors of the control circuit B1 may occur when the potential of the input terminal P1 becomes lower than the potential of the emitter terminal P2 of the IGBT Z1. However, in the structure of the circuit connection shown in FIG. 2, the current, which is directed from the control circuit B1 to the input terminal P1, cannot flow due to the rectifying action of the Schottky barrier diode D2.

Hereupon, a leakage current may occur in the Schottky barrier diode D2 when the current is stopped due to its rectifying action. Thus, in order to prevent the occurrence of latch-up of the parasitic thyristors due to the leakage current, the current flowing from the control circuit B1 through the Schottky barrier diode D2 is bypassed by the Schottky barrier diode D3.

Each of the Schottky barrier diodes D2, D3, from the nature of itself, has a higher saturation current of the pn junction in comparison with a diode formed on a polysilicon layer in a conventional semiconductor device of the above-mentioned type so that the generated voltage in the forward direction becomes lower. Hereupon, the voltage of the junction in the forward direction is expressed by the following Equation 1

$Vf=(k \cdot T/q)ln(If/Is)$  Equation 1

In Equation 1, Vf denotes the voltage drop which occurs when the current If in the forward direction flows. The Vf is obtained on the basis of the Boltzmann constant k, the absolute temperature T (°K) and the saturation current Is (A). According to Equation 1, also, it may be understood that the voltage drop in the forward direction becomes smaller when the saturated current is higher.

Meanwhile, in the diode formed on the polysilicon layer, the impurities are diffused from the upper portion to the lower portion of the polysilicon layer formed by the deposition process. Therefore, the area of the pn junction may be determined by the length of the junction in the plane view and the thickness of the polysilicon layer.

On the other hand, in the Schottky barrier diodes D2, D3, the pn junction is formed in such a region that the ntype diffused layer U15 is joined with the metal. Therefore, the area of the junction may become larger in comparison with that of the conventional case if the area of the element is approximately identical to that of the conventional case.

As described above, the voltage in the forward direction, which is lower than the voltage between the base and the emitter of the npn type parasitic transistor that occurs in the control circuit B1, may be easily obtained due to such a matter that the saturated current of the junction itself is lower and that the ratio (or efficiency) of the area of the junction to the occupying area is higher. In addition, a high level proof voltage for latch-up of the parasitic thyristor, which is higher than that of the conventional structure of the circuit connection, may be easily obtained, due to the effect to restrain the leakage current by the rectifying action of the Schottky barrier diode.

Second Embodiment

Figure 3:
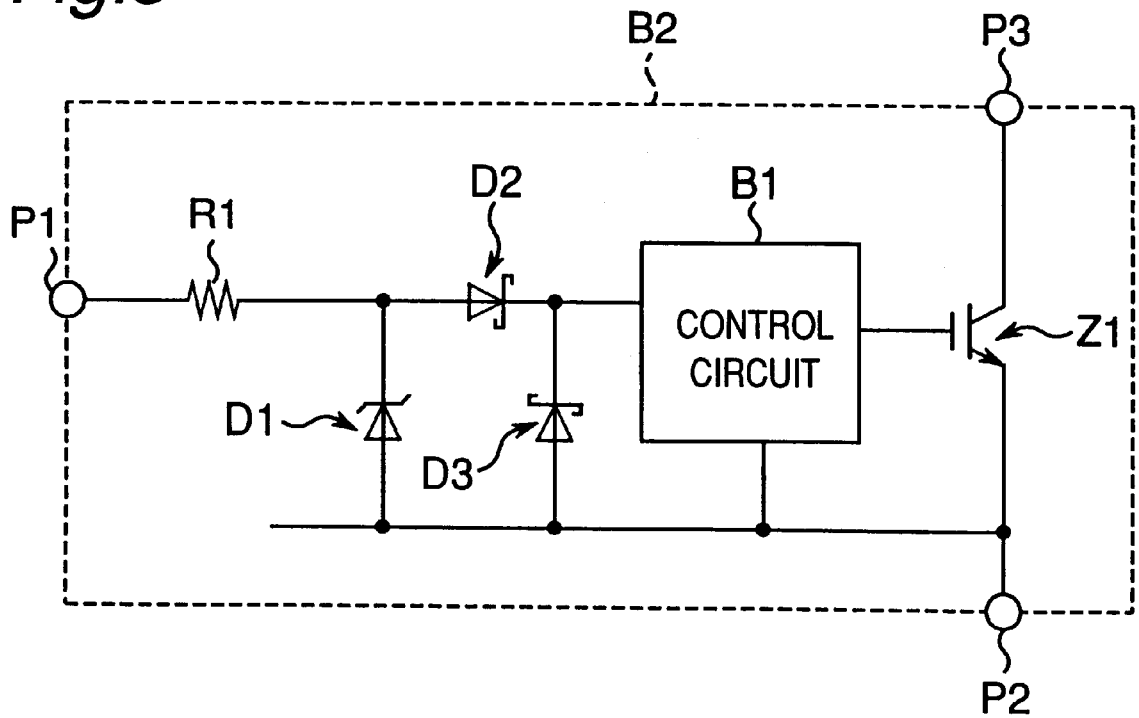
FIG. 3 is a circuit diagram of a semiconductor device according to a second embodiment of the present invention, in which an IGBT and a control circuit are formed on a same substrate.

Hereinafter, the second embodiment of the present invention will be concretely described with reference to FIG. 3.

However, the most part of the construction of the semiconductor device or the circuit connection according to the second embodiment is common with that of the semiconductor device or the circuit connection according to the first embodiment. Therefore, in order to avoid duplicate descriptions, characteristics, which are different from those of the first embodiment, will be mainly described hereinafter.

As described above, in the first embodiment, the input terminal P1 is directly connected to the cathode of the Zener diode D1 formed on the polysilicon layer and to the anode of the Schottky barrier diode D2. On the other hand, in the second embodiment, the input terminal P1 is connected to the cathode of the Zener diode D1 and the anode of the Schottky barrier diode D2 through a resistor R1 formed on the polysilicon layer, as shown in FIG. 3. The other features are nearly as same as the case of the first embodiment.

According to the above-mentioned structure of the circuit connection, the range of the voltage, which can be applied between the input terminal P1 and the emitter terminal P2 of the IGBT Z1, may be extended.

Third Embodiment

Figure 4:
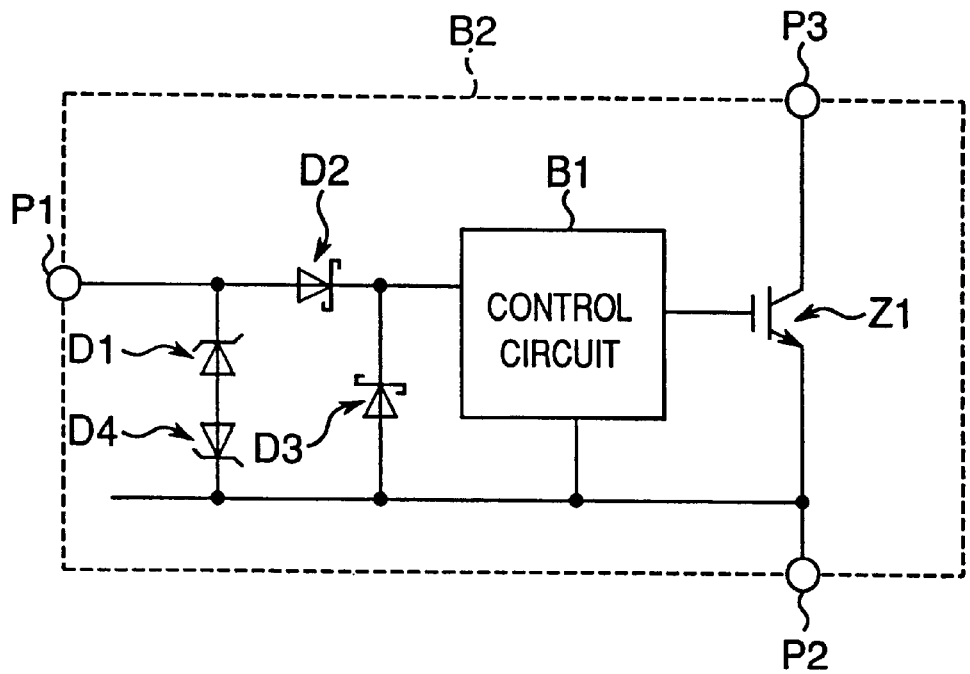
FIG. 4 is a circuit diagram of a semiconductor device according to a third embodiment of the present invention, in which an IGBT and a control circuit are formed on a same substrate.

Hereinafter, the third embodiment of the present invention will be concretely described with reference to FIG. 4. However, the most part of the construction of the semiconductor device or the circuit connection according to the third embodiment is common with that of the semiconductor device or the circuit connection according to the second embodiment. Therefore, in order to avoid duplicate descriptions, characteristics, which are different from those of the second embodiment, will be mainly described hereinafter.

As described above, in the second embodiment, in order to expand the range of the voltage, which can be applied between the input terminal P1 and the emitter terminal P2 of the IGBT Z1, the resistor R1 is interposed in the circuit. On the other hand, in the third embodiment, as shown in FIG. 4, there is used such a circuit that the Zener diode D1 and another Zener diode D4 are connected to each other in the bi-directional state, namely that the both Zener diodes D1, D4 are connected to each other in series and in the reverse direction. The other features are nearly as same as the case of the second embodiment.

Thereby, if a voltage, which is negative against the emitter terminal P2 of the IGBT Z1, is applied to the input terminal P1, a current may not flow till the negative voltage reaches the proof voltage of the Zener diode D1 in the reverse direction. However, when the voltage is over the proof voltage of the Schottky barrier diode D2, the proof voltage of each of the Zener diodes D1, D4 is required to be set to a value lower than the proof voltage of each of the Schottky barrier diodes D2, D3 because the current rapidly increases.

In addition to the above-mentioned construction, the resistor R1 formed of polysilicon may be interposed (in a combined state) in the circuit so as to correspond to the input voltage of wider range, as same as the case of the second embodiment.

Fourth Embodiment

Figure 5:
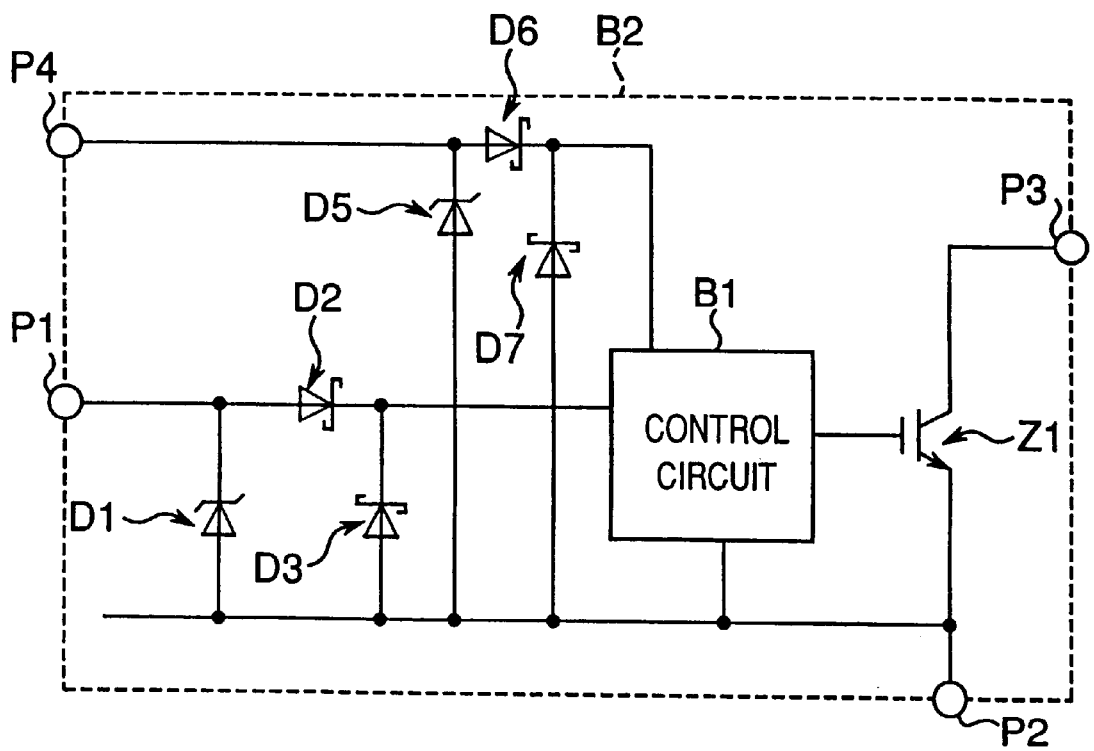
FIG. 5 is a circuit diagram of a semiconductor device according to a fourth embodiment of the present invention, in which an IGBT and a control circuit are formed on a same substrate.

Hereinafter, the fourth embodiment of the present invention will be concretely described with reference to FIG. 5. However, the most part of the construction of the semiconductor device or the circuit connection according to the fourth embodiment is common with that of the semiconductor device or the circuit connection according to any one of the first to third embodiments. Therefore, in order to avoid duplicate descriptions, characteristics, which are different from those of any one of the first to third embodiments, will be mainly described hereinafter.

As described above, in any one of the first to third embodiments, the semiconductor device is provided with the only one input terminal P1. On the other hand, in the fourth embodiment, the semiconductor device is provided with a plurality of input terminals, as shown in FIG. 5. In FIG. 5, P4 denotes another additional input terminal. D5 denotes a further Zener diode formed on the polysilicon layer as same as the Zener diode D1, the Zener diode D5 being added in correspondence with the addition of the input terminal P4. D6 and D7 denote further Schottky barrier diodes formed as same as the Schottky barrier diode D2, D3, the Schottky barrier diodes D6, D7 being added in correspondence with the addition of the input terminal P4. A further circuit for preventing latch-up of the parasitic thyristors, which is composed of the additional diodes D5, D6, D7, is connected to the control circuit B1 as same as the case of the established circuit for preventing latch-up of the parasitic thyristors.

An advantage of providing the plural input terminals P1, P4 (or increasing the input terminal) as described above, is such an effect that the function of the control performed by the control circuit B1 is improved. For example, in each of the structures of the circuit connections shown in FIGS. 2 to 4 (the first to third embodiments), the control circuit Bi must necessarily have such a construction that the voltage applied to the input terminal P1 is used as the voltage source for driving the circuit because only one input terminal P1 is provided. In this case, because the applied voltage changes in a wider range including zero voltage, it may be extremely difficult to design a circuit which can obtain a desired circuit properties within the above-mentioned range.

On the other hand, if the plural input terminals P1, P4 are provided as the case of the fourth embodiment while, for example, a stabilized source voltage is applied to them using them as the terminal for power sources, it may become easy to construct a circuit of higher function or higher accuracy. Further, more input signals for performing the control can be got so that a higher function of the device may be achieved.

Fifth Embodiment

Hereinafter, the fifth embodiment of the present invention will be concretely described with reference to FIG. 6. However, the most part of the construction of the semiconductor device or the circuit connection according to the fifth embodiment is common with that of the semiconductor device or the circuit connection according to the first embodiment. Therefore, in order to avoid duplicate descriptions, characteristics, which are different from those of the first embodiment, will be mainly described hereinafter.

In the first embodiment, each of the Schottky barrier diodes D2, D3 used in the circuit for preventing latch-up of the parasitic thyristors has such a construction that the p type diffused layer U13, which is referred to "guard ring", is formed around the junction between the metal wiring layer U6 and the n⁻ type diffused layer U15 of lower concentration. On the other hand, in the fifth embodiment, as shown in FIG. 6, a particular process for forming the diffused layer to form the Schottky barrier diodes D2, D3 is not performed, but the diffused layer used for forming other elements is diverted to the guard ring so as to obtain a required diode properties. That is, the Schottky barrier diodes D2, D3 is made of the diffused layer which is used for forming other elements. Hereupon, the guard ring is used in a general technique for improving the property of the proof voltage of the Schottky barrier diode in the reverse direction.

Figure 6:
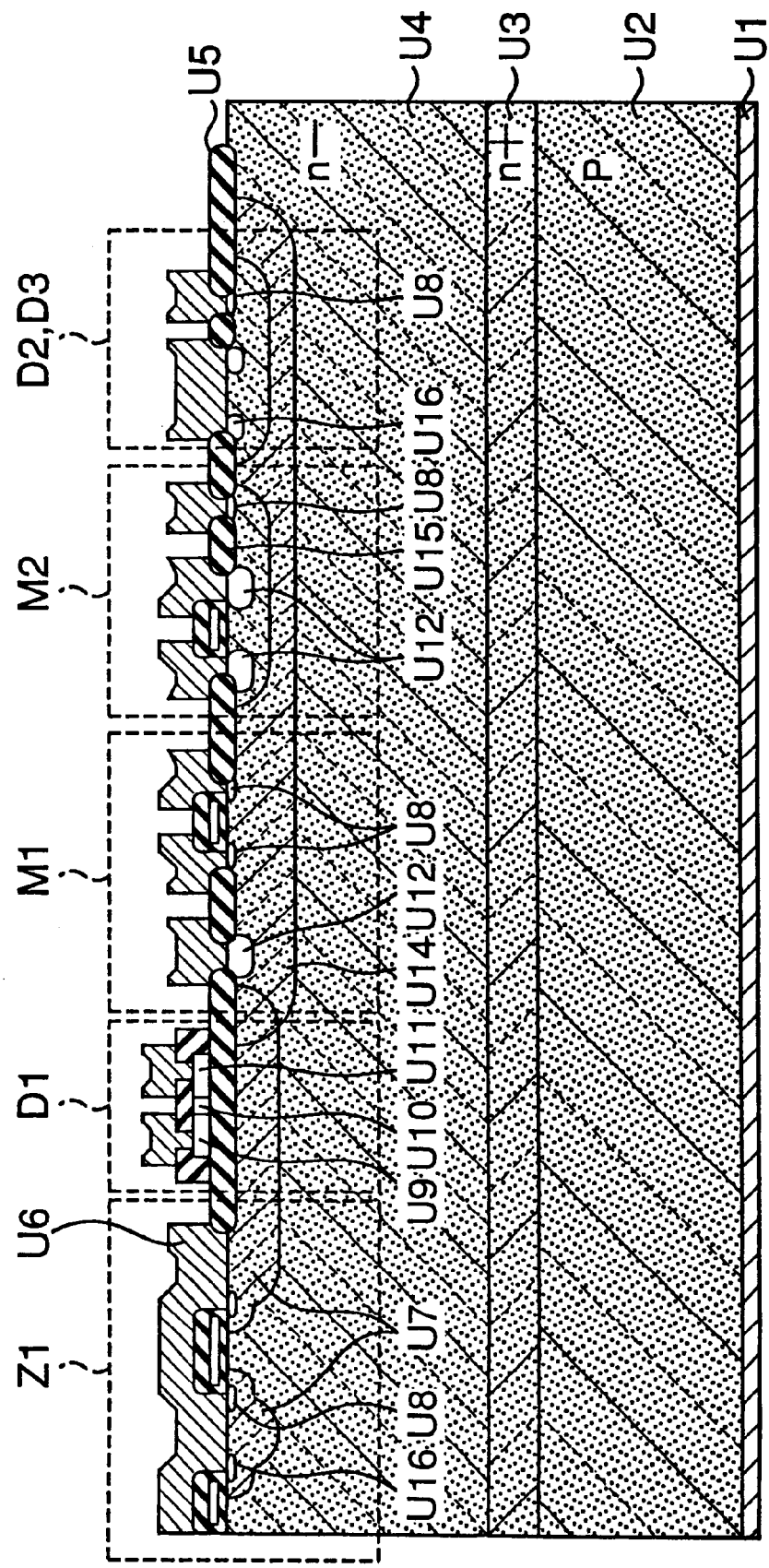
FIG. 6 is a vertical section of a semiconductor device according to a fifth embodiment of the present invention, in which an IGBT and a control circuit are formed on a same substrate.

In FIG. 6, the Schottky barrier diodes D2, D3 are formed by using the p type diffused layer U16 which is required when the IGBT Z1 is formed. However, if another diffused layer, for example such as the $p^+$ type diffused layer U7 or the $p^+$ type diffused layer U12 or the like is used, the same diode properties as the above may be achieved. But, because the p type diffused layer U16 is formed in order to form an inversion layer (channel) on the surface of the semiconductor during the process for forming the IGBT Z1 as same as the case of the MOSFET, it has a comparatively lower concentration and a shallower shape in comparison with other diffused layers. Thus, by using it as the guard ring, the influence of the parasitic device at the guard ring may be reduced.

As described above, by using another process both as the process required for forming the guard ring, the number of the steps required for manufacturing the semiconductor device may be reduced. In consequence, the semiconductor device may be formed with a lower manufacturing cost.

Sixth Embodiment

Figure 7:
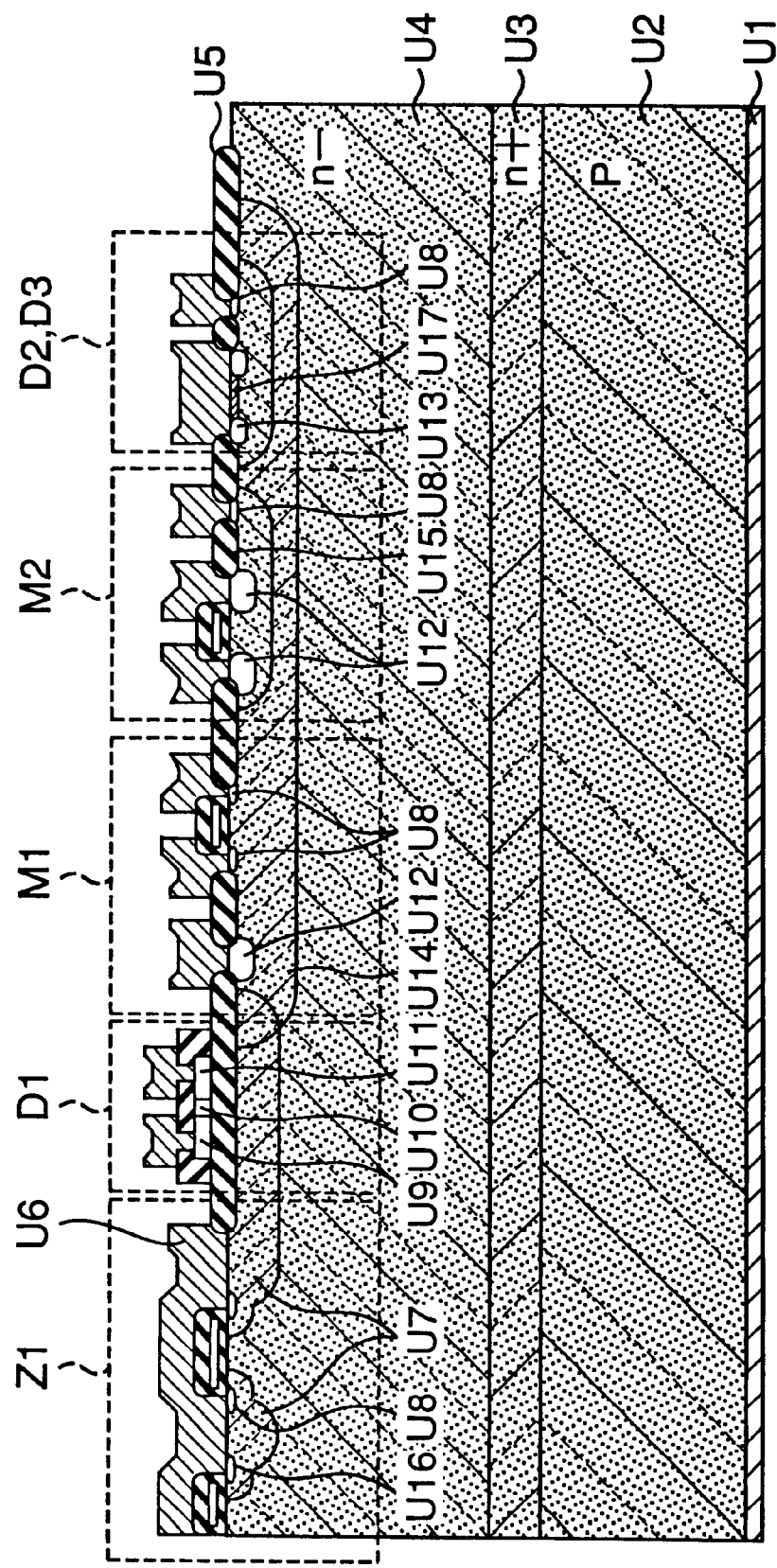
FIG. 7 is a vertical section of a semiconductor device according to a sixth embodiment of the present invention, in which an IGBT and a control circuit are formed on a same substrate.

Hereinafter, the sixth embodiment of the present invention will be concretely described with reference to FIG. 7. However, the most part of the construction of the semiconductor device or the circuit connection according to the sixth embodiment is common with that of the semiconductor device or the circuit connection according to the first or fifth embodiment. Therefore, in order to avoid duplicate descriptions, characteristics, which are different from those of the first or fifth embodiment, will be mainly described hereinafter.

In the first or fifth embodiment, when the Schottky barrier diodes D2, D3 are formed, Al (aluminum) or Al containing a minute quantity of another element (Si etc.) is used as the material of the metal wiring layer U6. Then it is joined to the $n^-$ type diffused layer U15 of lower concentration. On the other hand, in the sixth embodiment, another metal is diffused in the junction of the Schottky barrier diodes D2, D3. That is, it is known in general that a diode having such a property that the voltage in the forward direction is very low can be obtained, if a metal element such as Pt is diffused in silicon. So, in the sixth embodiment, the property of the voltage in the forward direction of the diode is preferentially considered so that the metal element such as Pt is diffused in the junction between the Si and the metal.

Thereby, the diode having such a property that the voltage in the forward direction is very low can be obtained. In consequence, the effect to prevent latch-up of the parasitic thyristors may be improved while the voltage applied to the input terminal may be transmitted to the control circuit with a smaller voltage loss.

Although the present invention has been described in relation to particular embodiments thereof, many other variations and modifications will become apparent to those skilled in the art. It is preferred, therefore, that the present invention be limited not by the specific disclosure herein, but only by the appended claims.

What is claimed is:

1. A semiconductor device in which an insulated gate bipolar transistor and a circuit region or circuit element for control use are formed on a same semiconductor substrate, comprising:

a first diffused layer formed in said semiconductor substrate so as to be located near a surface of said semiconductor substrate, said first diffused layer having a conduction type different from that of said semiconductor substrate;

a second diffused layer formed in said semiconductor substrate so as to be located near the surface of said semiconductor substrate, said second diffused layer being located within said first diffused layer, and said second diffused layer having a conduction type different from that of said first diffused layer;

a first region formed on said second diffused layer, said first region being formed by removing a portion of an insulating film;

a first metal wiring layer formed in said first region;

a third diffused layer located in said second diffused layer or located so as to intersect with said second diffused layer, said third diffused layer having a conduction type identical to that of said second diffused layer;

a second region formed on said third diffused layer, said second region being formed by removing another portion of the insulating film;

a second metal wiring layer formed in said second region; and a protection circuit formed by combining a Schottky barrier diode using said first and second metal wiring layers as electrodes and a Zener diode formed by depositing polycrystalline silicon on the insulating film on said semiconductor substrate, said protection circuit being connected to at least one of input terminals of the semiconductor device, wherein said circuit region or circuit element is connected to said input terminal through said protection circuit and to a gate of said insulated gate bipolar transistor.

2. The semiconductor device according to claim 1, wherein each of said first and second metal wiring layers is composed of aluminum or aluminum containing a minute quantity of other element.

3. The semiconductor device according to claim 2, further comprising a fourth diffused layer formed so as to surround a junction between said second diffused layer and said first metal wiring layer, said fourth diffused layer having a conduction type different from that of said second diffused layer.

4. The semiconductor device according to claim 3, wherein said Schottky barrier diode includes a first and second Schottky barrier diode members while said Zener diode includes a Zener diode member, a cathode of said Zener diode member and an anode of said first Schottky barrier diode member being connected to the input terminal of the semiconductor device, a cathode of said first Schottky barrier diode member being connected to a cathode of said second Schottky barrier diode member and to said circuit region or circuit element, and an anode of said Zener diode member and an anode of said second Schottky barrier diode member being connected to an emitter of said insulated gate bipolar transistor.

5. The semiconductor device according to claim 4, wherein the input terminal of the semiconductor device is connected to one end portion of a resistor while the other end portion of the resistor is connected to the cathode of said Zener diode member and to the anode of said first Schottky barrier diode member.

6. The semiconductor device according to claim 4, wherein said Zener diode includes a further Zener diode member, an anode of the further Zener diode member being connected to the anode of said Zener diode member, and a cathode of said further Zener diode member being connected to the emitter of said insulated gate bipolar transistor.

7. The semiconductor device according to claim 4, further comprising one or more input terminal, wherein said semiconductor device includes at least one circuit having a construction as same as that of said circuit composed of the Zener diode member and the first and second Schottky barrier diode members.

8. The semiconductor device according to claim 3, wherein said fourth diffused layer is composed of a diffusion layer used for forming said insulated gate bipolar transistor.

9. The semiconductor device according to claim 3, further comprising a metal-diffused layer located between said second diffused layer and said first metal wiring layer, said metal-diffused layer being formed by diffusing or depositing a metal between said second diffused layer and said first metal wiring layer, said diffused or deposited metal being different from the metal composing said first metal wiring layer.

10. The semiconductor device according to claim 9, wherein said diffused or deposited metal is platinum.

* * * * *